(12) United States Patent
Tadaoka (10) Patent No.: US 8,030,766 B2
(45) Date of Patent: Oct. 4, 2011

(54) SEMICONDUCTOR DEVICE

(75) Inventor: Akihiko Tadaoka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 50 days.

(21) Appl. No.: 12/253,383

(22) Filed: Oct. 17, 2008

(65) Prior Publication Data

US 2009/0102029 A1 Apr. 23, 2009

(30) Foreign Application Priority Data

Oct. 19, 2007 (JP) ................................. 2007-272443

(51) Int. Cl.
*H01L 23/49* (2006.01)

(52) U.S. Cl. ................. 257/735; 257/773; 257/E23.034; 257/E23.078

(58) Field of Classification Search .................. 438/112, 438/123, 124, FOR. 379, FOR. 377; 257/E21.511, 257/E23.034, E23.078, 735, 773
See application file for complete search history.

(56) References Cited

U.S. PATENT DOCUMENTS

| | | | | |
|---|---|---|---|---|
| 4,607,276 A | * | 8/1986 | Butt | 257/674 |
| 4,961,984 A | * | 10/1990 | Takeda | 428/192 |
| 5,164,336 A | * | 11/1992 | Ohno et al. | 228/180.22 |
| 5,245,215 A | * | 9/1993 | Sawaya | 257/676 |
| 5,352,632 A | * | 10/1994 | Sawaya | 29/827 |
| 5,606,199 A | * | 2/1997 | Yoshigai | 257/666 |
| 6,326,243 B1 | * | 12/2001 | Suzuya et al. | 438/124 |
| 6,433,409 B2 | * | 8/2002 | Mita et al. | 257/673 |
| 6,646,355 B2 | * | 11/2003 | Kang et al. | 257/784 |
| 6,897,090 B2 | * | 5/2005 | DiStefano et al. | 438/106 |
| 7,547,094 B2 | * | 6/2009 | Kawamura et al. | 347/50 |

FOREIGN PATENT DOCUMENTS

JP 10-116953 5/1998

* cited by examiner

*Primary Examiner* — George Fourson, III
(74) *Attorney, Agent, or Firm* — Fish & Richardson P.C.

(57) ABSTRACT

A semiconductor device that can cope with larger numbers of pins and finer pitches while suppressing lowering of the manufacturing yield and reliability includes: a semiconductor chip having a plurality of electrodes provided on an upper surface thereof; a plurality of lead terminals including inner lead portions disposed toward the semiconductor chip; a sheet-form wiring member having a plurality of conductors insulated from one another on one main surface thereof; and a sealing-resin layer for sealing at least the semiconductor chip, the inner lead portions and the wiring member. The electrodes of the semiconductor device and the inner lead portions of the lead terminals are electrically connected respectively to each other via the conductors of the wiring member.

11 Claims, 5 Drawing Sheets

SEMICONDUCTOR DEVICE

This nonprovisional application claims priority under 35 U.S.C. §119(a) on Patent Application No. 2007-272443 filed on Oct. 19, 2007, the entire contents of which are hereby incorporated by reference.

BACKGROUND OF THE INVENTION

1. Field of the Invention

The present invention relates to semiconductor devices, and in particular to a semiconductor device of the resin-sealed type formed with a lead frame.

2. Description of Related Art

As an example of semiconductor devices of a resin-sealed type that are formed with a lead frame, those of a QFP (Quad Flat Package) type are conventionally known. Generally, in QFP type semiconductor devices, by narrowing the width of the inner lead portions (lead terminals) of the lead frame, larger number of pins and finer pitches are achieved so as to cope with higher degrees of integration in semiconductor elements.

However, since there is a limit to the formation of the width of inner lead portions (lead terminals), in a case where the number of inner lead portions (lead terminals) is increased so as to cope with an increased number of pins, it is necessary to enlarge the size of the lead frame itself. And as the lead frame is enlarged, the distances between electrode pads of a semiconductor chip and the inner lead portions corresponding thereto are lengthened. Accordingly, there arises a disadvantage that the bonding wires that electrically connect the electrode pads and the inner lead portions are lengthened.

Here, if the lengths of the bonding wires exceed a predetermined length, so-called wire sweep takes place in which the bonding wires are deformed in the flow direction of sealing resin during the process of resin-sealing the semiconductor chip with the sealing resin. As a result, there arises a disadvantage that a short-circuit occurs owing to the mutual contact of adjacent bonding wires. Generally, in a semiconductor device of a QFP type, of all the bonding wires, those at the corners of the semiconductor chip are longest, and therefore the occurrence of the aforementioned wire sweep is noticeable at the corners of the semiconductor device.

In this connection, there is conventionally known a QFP type semiconductor device capable of suppressing the wire sweep at the corners thereof. A semiconductor device of this type is described, for example, in Japanese Unexamined Patent Application Publication (JP-A) No. H10-116953. This publication discloses a QFP type semiconductor device in which the inner lead portions connected to the electrode pads at the corners of the semiconductor chip are arranged closer to the semiconductor chip than the adjacent inner lead portions are. In the conventional semiconductor devices structured in this manner, it is possible to prevent the bonding wires at the corners from becoming longer than the rest, and therefore it is possible to suppress the wire sweep at the corners of the semiconductor device.

However, in the conventional semiconductor device disclosed in the aforementioned publication JP-A No. H10-116953, in a case where the number of lead terminals (inner lead portions) is further increased so as to cope with an even larger number of pins, the lead frame becomes even larger, and therefore there arises a disadvantage that the bonding wires except those at the corners of the semiconductor device become longer than a predetermined length. Thus, with the structure described above, the semiconductor device, though capable of suppressing the wire sweep at the corners thereof, yet has a disadvantage that the wire sweep still occurs at any part of the device other than the corners. Accordingly, in a case where even larger numbers of pins and even finer pitches are to be coped with, the semiconductor device in JP-A No. H10-116953 raises a problem of lowering the manufacturing yield and reliability of the semiconductor device due to a short-circuit between bonding wires resulting from the wire sweep. Incidentally, it is difficult to overcome the above-mentioned disadvantages and problems by changing the conditions of the resin-sealing process or changing the material of the bonding wires.

SUMMARY OF THE INVENTION

In light of the foregoing, it is an object of the present invention to provide a semiconductor device that can cope with even larger numbers of pins and even finer pitches while suppressing the lowering of the manufacturing yield and reliability of the semiconductor device.

In order to achieve the above object, according to one aspect of the present invention, a semiconductor device includes: a semiconductor chip having a plurality of electrodes provided on a surface on one side thereof; a plurality of lead terminals having one end portions thereof disposed toward the semiconductor chip; a sheet-form wiring member having a plurality of conductors insulated from one another on one main surface thereof; and a sealing-resin layer for sealing at least the semiconductor chip, the one end portions of the lead terminals and the wiring member, wherein the electrodes of the semiconductor chip and the one end portions of the lead terminals are electrically connected respectively to each other via the conductors of the wiring member.

As described above, the semiconductor device in accordance with this aspect of the present invention is provided with the sheet-form wiring member having the plurality of conductors insulated from one another on the one main surface thereof, and via the conductors of the wiring member, the electrodes and the one end portions of the lead terminals are electrically connected respectively to each other. Thereby, unlike a case where bonding wires are used for electrical connection between the electrodes of the semiconductor chip and the one end portions of the lead terminals, the occurrence of a problem such as wire sweep can be suppressed. That is, during the process of resin-sealing the semiconductor chip with the sealing-resin layer, the conductors provided on the sheet-form wiring member are difficult to deform in the flow direction of the sealing resin as compared with the bonding wires. Accordingly, even in a case where the distances between the electrode pads of the semiconductor chip and the one end portions of the lead terminals corresponding thereto are lengthened and the pitch of the conductors on the wiring member is narrowed so as to cope with larger numbers of pins and finer pitches, a short-circuit between adjacent conductors can be prevented. Consequently, it is possible to suppress the lowering of the manufacturing yield and reliability even in a case where even larger numbers of pins and even finer pitches are to be coped with.

In the semiconductor device in accordance with the above-described aspect of the present invention, a metal bump is preferably formed on the electrodes of the semiconductor chip and on the one end portions of the lead terminals. With this structure, the electrodes of the semiconductor chip and the one end portions of the lead terminals can be electrically connected respectively to each other with ease. Consequently, it is possible to cope with even larger numbers of pins and even finer pitches while suppressing the lowering of the manufacturing yield and reliability with ease.

In this case, the metal bump is preferably a stud bump. With this structure, the electrodes of the semiconductor chip and the one end portions of the lead terminals can be electrically connected respectively to each other with more ease. Consequently, it is possible to cope with even larger numbers of pins and even finer pitches while suppressing the lowering of the manufacturing yield and reliability with more ease.

In the above-described semiconductor device in accordance with the above-described aspect of the present invention, the sheet-form wiring member may include a sheet-form polyimide member.

Preferably, the semiconductor device in accordance with the above-described aspect of the present invention is structured such that the upper surfaces of the one end portions of the lead terminals are at substantially a same height as the surface on the one side of the semiconductor chip. With this structure, the electrodes of the semiconductor chip and the one end portions of the lead terminals can be electrically connected respectively to each other with more ease. Consequently, it is possible to cope with even larger numbers of pins and even finer pitches while suppressing the lowering of the manufacturing yield and reliability with more ease.

Preferably, the semiconductor device in accordance with the above-described aspect of the present invention is formed into the QFP type package by sealing the semiconductor chip in the sealing-resin layer. This structure makes it possible to easily obtain semiconductor devices that can cope with larger numbers of pins and finer pitches while suppressing the lowering of the manufacturing yield and reliability of the semiconductor devices.

As described above, according to the present invention, it is possible to easily obtain semiconductor devices that can cope with even larger numbers of pins and even finer pitches while suppressing the lowering of the manufacturing yield and reliability of the semiconductor devices.

DETAILED DESCRIPTION OF PREFERRED EMBODIMENTS

A preferred embodiment of the present invention will be described in detail below with reference to the accompanying drawings. This embodiment deals with a case where the present invention is applied to a QFP type semiconductor device as an example of resin-sealed type semiconductor devices.

First, with reference to FIGS. 1 to 5, a structure of a semiconductor device in accordance with one embodiment of the present invention will be described.

Figure 1:
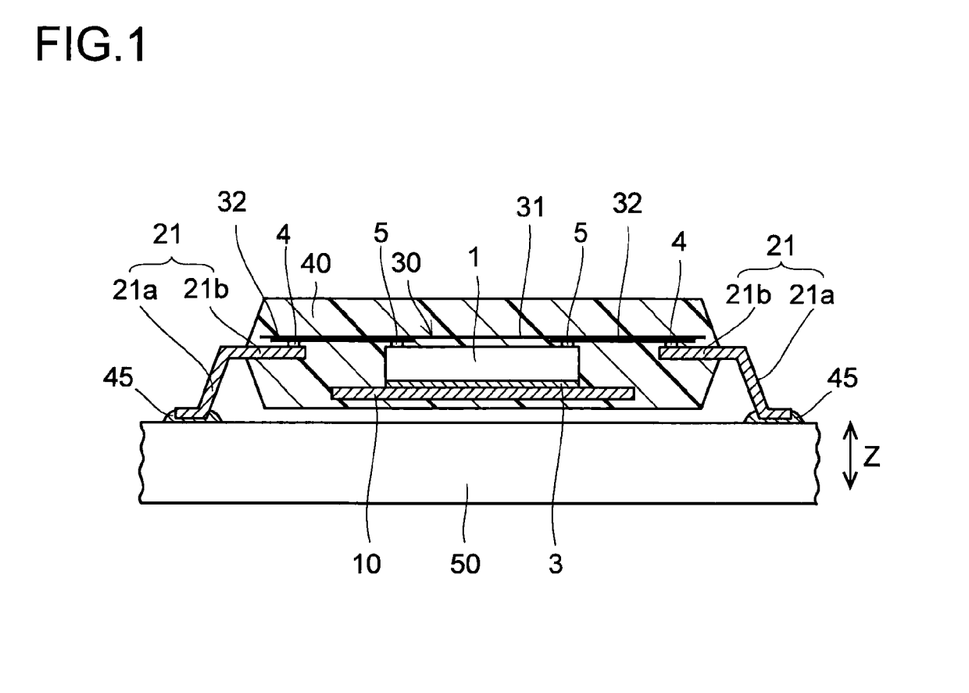
FIG. 1 is a cross sectional view of a semiconductor device in accordance with one embodiment of the present invention.

As shown in FIG. 1, the semiconductor device in accordance with the one embodiment of the present invention includes: a semiconductor chip 1; a die pad 10 having the semiconductor chip 1 mounted thereon; a plurality of lead terminals 21; a sheet-form wiring member 30 for electrically connecting the semiconductor chip 1 and the plurality of lead terminals 21; and a resin-sealing layer 40.

The semiconductor chip 1 includes a silicon substrate having an integrated circuit or the like formed on a main surface on one side (an upper surface) thereof. On a peripheral part of the main surface on one side (the upper surface, the surface on one side) of the semiconductor chip 1, a plurality of electrode pads 2 (see FIGS. 4 and 5) are arranged at a predetermined interval along the peripheral edges of the semiconductor chip 1. The semiconductor chip 1 is mounted on an upper surface of the die pad 10 via an adhesive layer made of solder or the like. Note that the electrode pads 2 are an example of "electrodes" according to the present invention.

Figure 4:
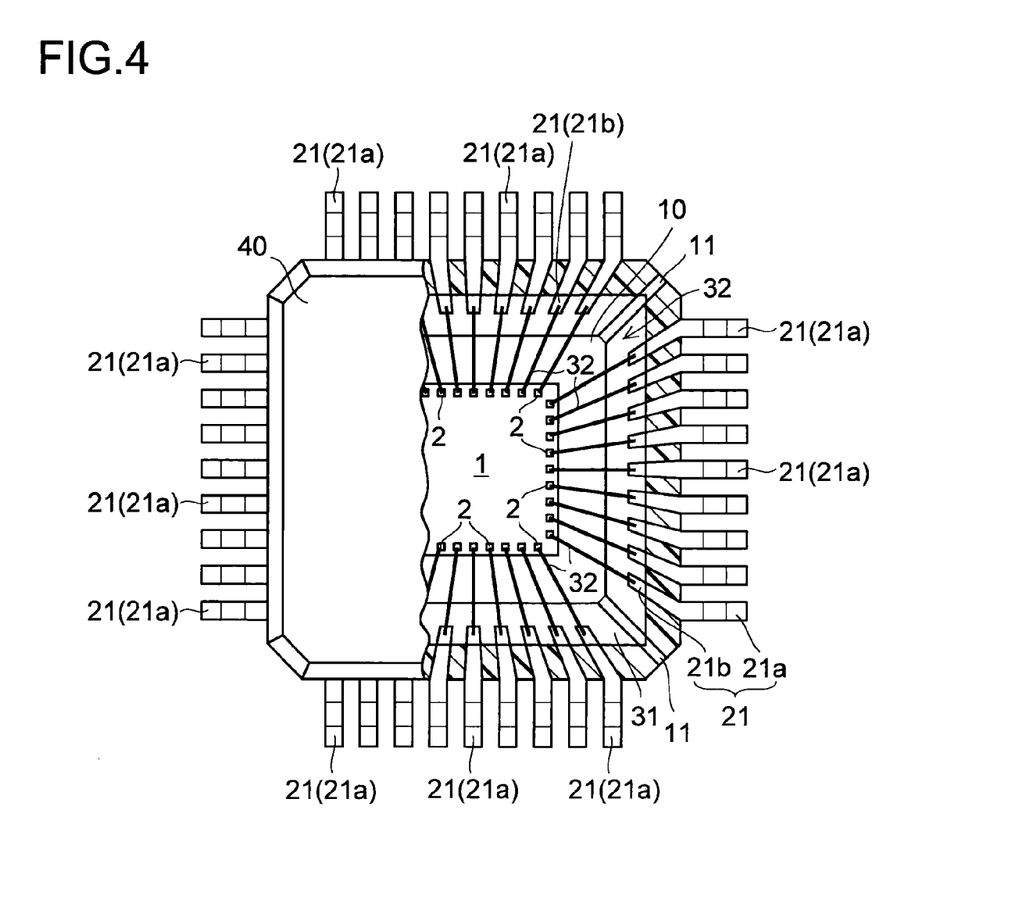
FIG. 4 is a plan view of the semiconductor device in accordance with the one embodiment of the present invention.
Figure 5:
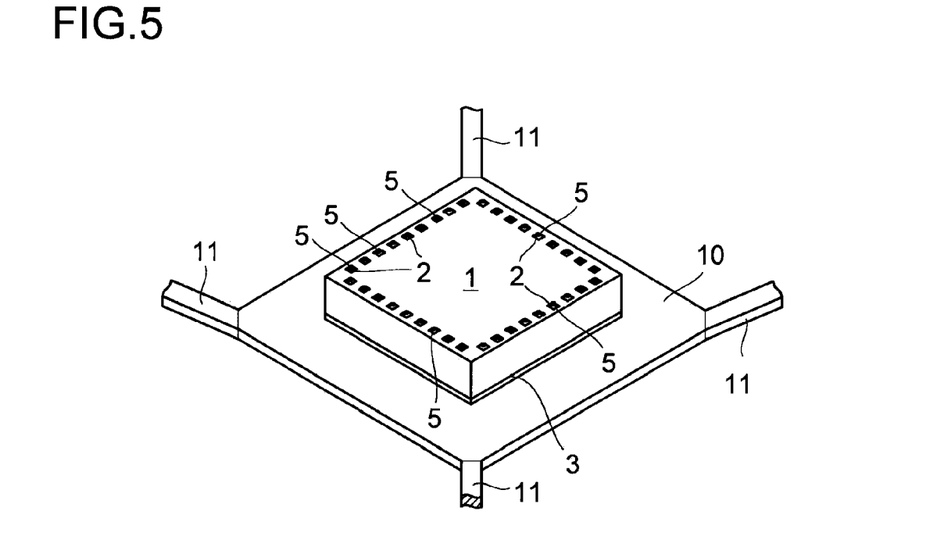
FIG. 5 is a perspective view for explaining a structure of a die pad of the semiconductor device in accordance with the one embodiment of the present invention.

As shown in FIGS. 4 and 5, the die pad 10 is formed in a substantially rectangular shape as seen in a plan view, and includes four suspension leads 11 integrally connected thereto. These four leads 11 are disposed at the four corners, respectively, of the die pad 10, and are formed so as to extend in a radial pattern as seen in a plan view. The suspension leads 11 are provided for holding the die pad 10 on a lead frame described later. Each of these suspension leads 11 is bent so as to allow the die pad 10 to be down-set. Thus, as shown in FIG. 1, the die pad 10 of this embodiment is disposed below inner lead portions 21b (the one end portions of the lead terminals 21) described later.

The lead terminals 21 are formed of a copper-based material (copper or copper alloy) such as phosphor bronze or oxygen-free copper. As shown in FIGS. 1 and 4, each of the lead terminals 21 includes an outer lead portion 21a, which is located outside the sealing-resin layer 40, and an inner lead portion 21b, which together with the semiconductor chip 1 is covered with the sealing-resin layer 40. With the lead terminals 21 bent into a gull-wing like shape as shown in FIG. 1, the outer lead portions 21a are mounted via a solder layer 45 on a mount target board 50.

The plurality of lead terminals 21 are arranged so as to be separated from one another and to surround the die pad 10 from four directions as shown in FIG. 4. More specifically, the lead terminals 21 are divided into four groups each having a predetermined number thereof, and those four groups each including the predetermined number of lead terminals 21 are arranged so as to surround the die pad 10 from four directions. Each of the lead terminals 21 is arranged such that the inner lead portion 21b (the one end portion of the lead terminal 21) thereof are disposed toward the semiconductor chip 1. By arranging the plurality of lead terminals 21 as described above, a predetermined number out of the plurality of lead terminals 21 in the gull-wing like shape are pulled out in each of the four directions.

Figure 2:
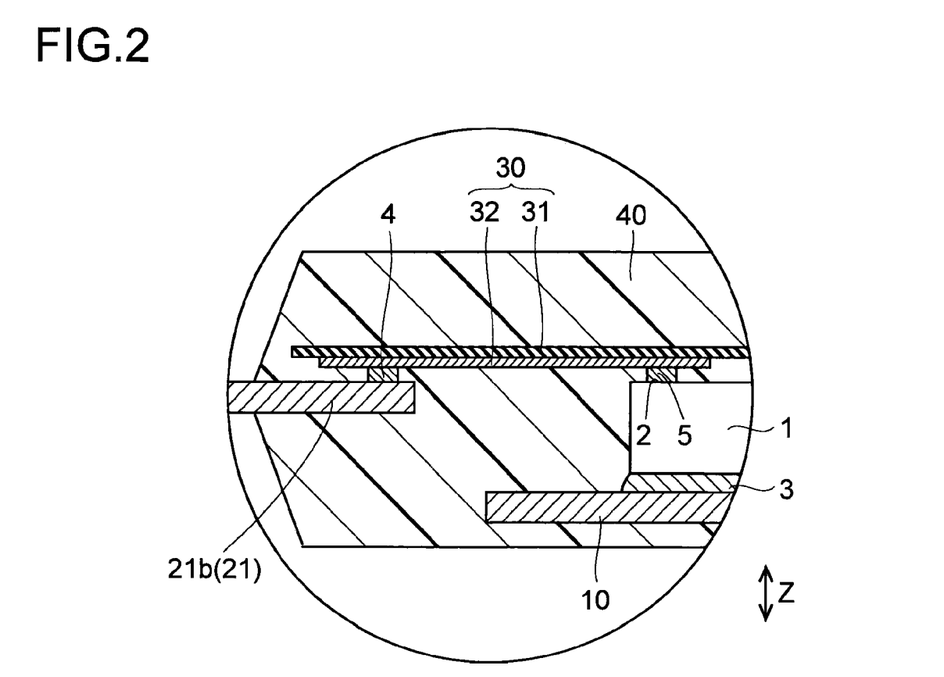
FIG. 2 is a partially enlarged cross sectional view of the semiconductor device in accordance with the one embodiment of the present invention.

In this embodiment, as shown in FIGS. 1 and 2, with the semiconductor chip 1 mounted on the upper surface of the die pad 10, the upper surface of the semiconductor chip 1 is at substantially a same height as the upper surfaces of the inner lead portions 21b in a Z-axis direction (a thickness direction of the semiconductor chip 1). On the upper surfaces of the inner lead portions 21b and on the upper surfaces of the electrode pads 2 of the semiconductor chip 1, metal stud bumps 4 and 5 are formed, respectively, that have a predetermined height and are made of gold (Au). The metal stud bumps 4 and 5 are an example of "metal bumps" and "stud bumps" according to the present invention. On the surfaces of the metal stud bumps 4 and 5, a plated-tin (Sn) layer (not shown) is formed.

Figure 3:
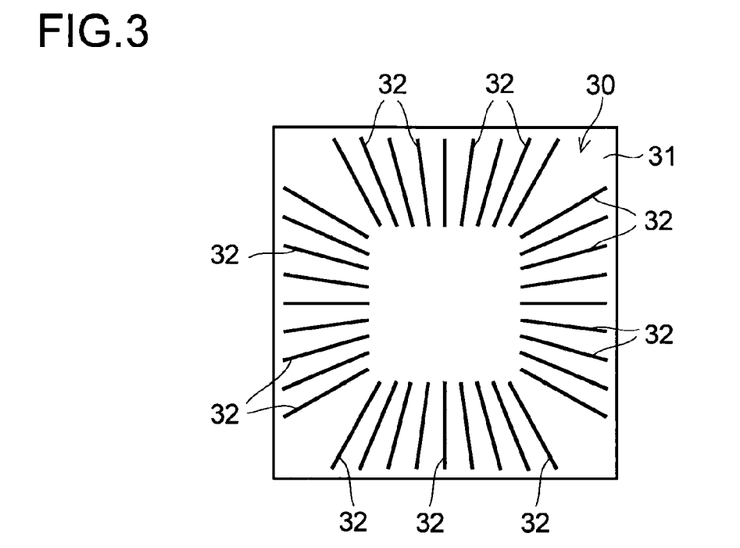
FIG. 3 is a plan view of a wiring member in accordance with the one embodiment of the present invention.

As shown in FIG. 3, the sheet-form wiring member 30 has a structure in which plurality of wiring layers 32 insulatively separated from one another are formed on a main surface on one side of the sheet-form wiring member (the sheet-form polyimide member 31). This sheet-form wiring member 30 (polyimide member 31) has a rectangular shape as seen in a plan view. The sheet-form wiring member 30 (polyimide member 31) is formed so as to have an area smaller than that of the sealing-resin layer 40 described later. On the other hand, the wiring layers 32 are each composed of a gold (Au) layer having a thickness of about 30 μm and are formed, by a deposition method or the like, into a wiring pattern that allows the inner lead portions 21b to be electrically connected to the electrode pads 2 corresponding thereto, respectively. Note that the wiring layers 32 are an example of "conductors" according to the present invention.

Moreover, in this embodiment, the lead terminals 21 and the semiconductor chip 1 are electrically connected to each other via the wiring layers 32 of the wiring member 30 described above. More specifically, as shown in FIG. 2, one and the other end portions of the wiring layers 32 are fixed to the metal stud bumps 4 formed on the inner lead portions 21b and to the metal stud bumps 5 formed on the electrode pads 2, respectively, by heat-press bonding (gold-tin eutectic bonding). Thereby, the inner lead portions 21b of the lead terminals 21 and the electrode pads 2 of the semiconductor chip 1 are electrically connected respectively to each other via the wiring layers 32.

The sealing-resin layer 40 is formed of, for example, heat-curing resin such as epoxy resin and has a function of protecting the semiconductor chip 1 and the wiring member 30 against gas or moisture by resin-sealing the semiconductor chip 1 and the wiring member 30. Moreover, seen in a plan view as in FIG. 4, the sealing-resin layer 40 is formed in a rectangular shape. That is, the sealing-resin layer 40 has four sides as seen in a plan view. At each of the four sides of the rectangular sealing-resin layer 40, the predetermined number of lead terminals 21 (outer lead portions 21a) protrude.

In this embodiment, as described above, the semiconductor device includes the sheet-form wiring member 30 having the plurality of wiring layers 32 insulated from one another on the main surface on the one side thereof. The electrode pads 2 and the inner lead portions 21b of the lead terminals 21 are electrically connected respectively to each other via the wiring layers 32 of that wiring member 30. Thereby, unlike a case where the bonding wires are used for the electrical connection between the electrode pads 2 of the semiconductor chip 1 and the inner lead portions 21b of the lead terminals 21, the occurrence of a problem such as wire sweep can be suppressed. That is, during the resin-sealing process of sealing the semiconductor chip 1 with the sealing-resin layer 40, the wiring layers 32 disposed on the sheet-form wiring member 30 are difficult to deform in a flow direction of the sealing resin as compared with the bonding wires. Even in a case where the distances between the electrode pads 2 and the inner lead portions 21b corresponding thereto are lengthened and the pitches of the wiring layers 32 are narrowed with the increasing numbers of pins and finer pitches, a short-circuit between the adjacent wiring layers 32 can be prevented. Consequently, even in a case where even larger numbers of pins and even finer pitches are to be coped with, it is possible to suppress the lowering of the manufacturing yield and reliability of the semiconductor device.

Moreover, in this embodiment, the metal stud bumps 4 and 5 are formed on the inner lead portions 21b of the lead terminals 21 and the electrode pads 2 of the semiconductor chip 1, respectively. Thereby, the wiring layers 32 of the wiring member 30 can be electrically connected to the electrode pads 2 of the semiconductor chip 1 and the inner lead portions 21b of the lead terminal 21 with ease, respectively, so that the electrical connections can be made between the electrode pads 2 of the semiconductor chip 1 and the inner lead portions 21b of the lead terminal 21 via the wiring layer 32 with ease. Consequently, it is possible to cope with even larger numbers of pins and finer pitches while suppressing the manufacturing yield and reliability of the semiconductor device with ease.

Furthermore, in this embodiment, the semiconductor device is structured such that the upper surfaces of the inner lead portions 21b are at substantially the same height as the upper surface of the semiconductor chip 1 in the thickness direction (the Z-axis direction) of the semiconductor chip 1. Thereby, the electrode pads 2 of the semiconductor chip 1 and the inner lead portions 21b of the lead terminals 21 can be electrically connected respectively to each other via the wiring layers 32 of the wiring members 30 with more ease. Consequently, it is possible to cope with even larger numbers of pins and finer pitches while suppressing the lowering of the manufacturing yield and reliability of the semiconductor device with more ease.

Furthermore, in this embodiment, the semiconductor device is formed into a QFP type package by sealing the semiconductor chip 1 in the sealing-resin layer 40. Thereby, it is possible to easily obtain semiconductor devices that can cope with even larger numbers of pins and finer pitches while suppressing the lowering of the manufacturing yield and reliability.

Next, a method for manufacturing the semiconductor device in accordance with this embodiment of the present invention will be described with reference to FIG. 1 and FIGS. 5 to 10.

Figure 6:
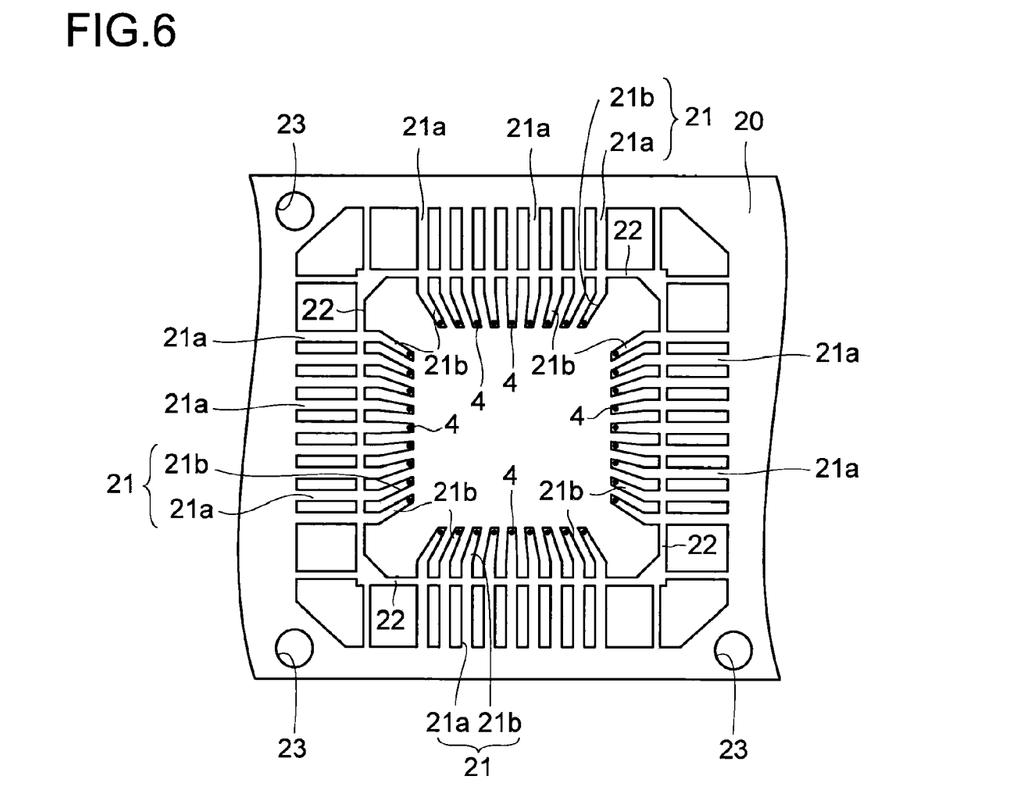
FIG. 6 is a plan view for explaining a method for manufacturing the semiconductor device in accordance with the one embodiment of the present invention.

First, as shown in FIG. 6, the lead frame 20 is integrally formed by performing punch-press or etching processing on a thin plate composed of a copper-based material (copper or copper alloy) such as phosphor bronze or oxygen-free copper. In this processing, the lead frame 20 is formed so as to include the plurality of lead terminals 21, dam portions 22 and positioning holes 23. Note that the lead frame 20 is formed so as not to include the die pad 10.

Thereafter, the metal stud bump 4 composed of gold (Au) is formed on the upper surfaces of the inner lead portions 21b of the lead frame 20. The die pad 10 is then formed, as a separate member from the lead frame 20, by performing punch-press or etching processing on a thin plate composed of copper-based material (copper or copper alloy) such as phosphor bronze or oxygen-free copper. In this processing, the die pad 10 is formed in a rectangular shape as seen in a plan view, and as shown in FIGS. 5 and 7, the suspension leads 11 are formed at the four corners of the die pad 10 integrally therewith so as to extend in a radial pattern as seen in a plan view.

Subsequently, the metal stud bump 5 composed of gold (Au) is formed on the upper surfaces of the electrode pads 2 of the semiconductor chip 1, and then the semiconductor chip 1 is mounted on the upper surface of the die pad 10 via the adhesive layer 3 as shown in FIG. 5.

Figure 7:
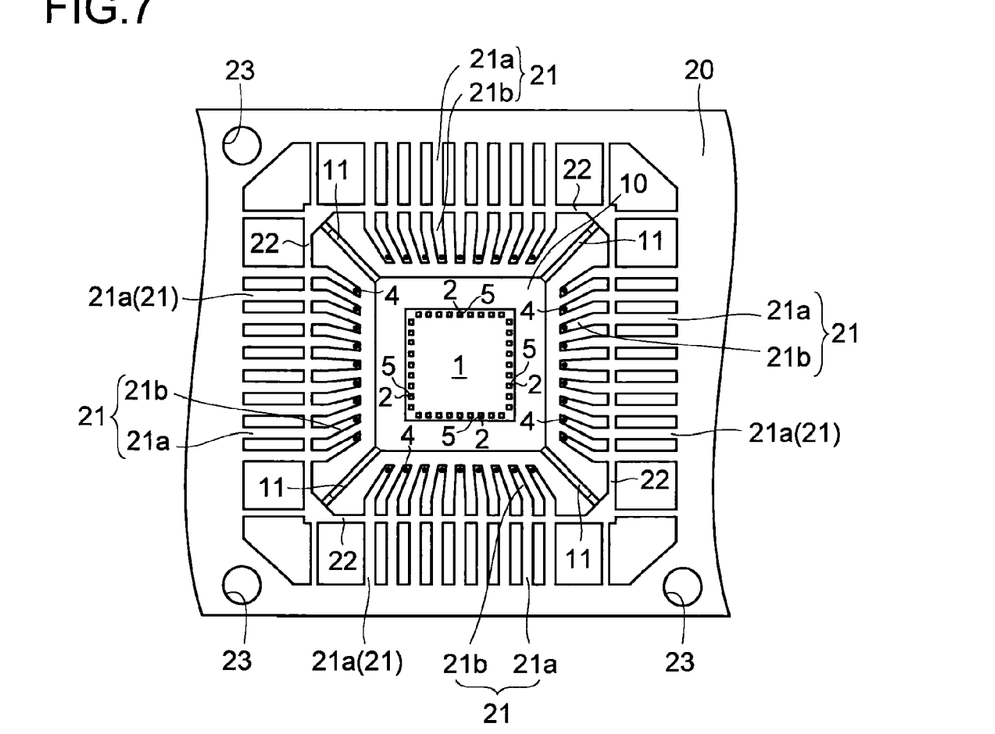
FIG. 7 is a plan view for explaining the method for manufacturing the semiconductor device in accordance with the one embodiment of the present invention.

Thereafter, the four suspension leads 11 are bent and the tip ends thereof are connected to predetermined positions on the lead frame 20 as shown in FIG. 7. Thereby, the die pad 10 is connected to the lead frame 20, with the former arranged below the inner lead portions 21b, so that the upper surface of the semiconductor chip 1 is at substantially the same height as the upper surfaces of the inner lead portions 21b in the Z-axis direction (the thickness direction of the semiconductor chip 1) as shown in FIG. 8.

Figure 8:
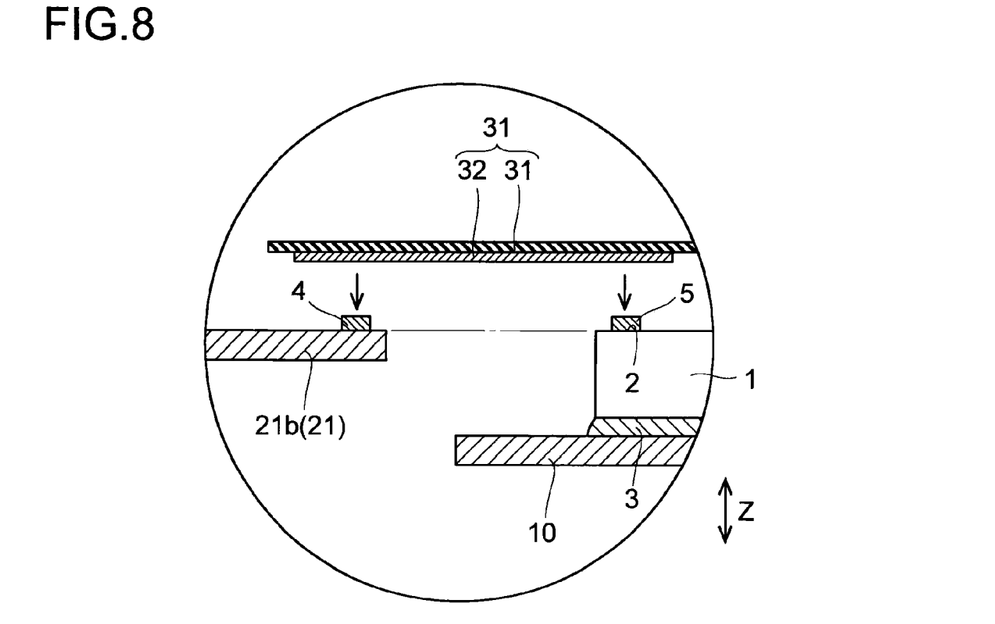
FIG. 8 is a cross sectional view of the method for manufacturing the semiconductor device in accordance with the one embodiment of the present invention.
Figure 9:
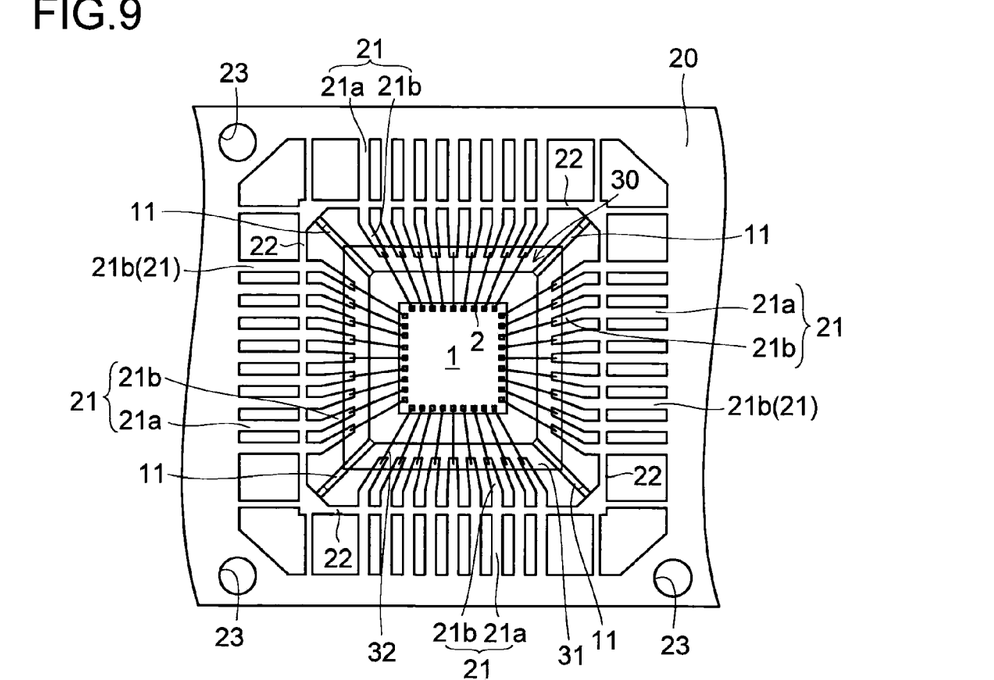
FIG. 9 is a plan view for explaining the method for manufacturing the semiconductor device in accordance with the one embodiment of the present invention.

Thereafter, as shown in FIGS. 8 and 9, the electrode pads 2 of the semiconductor chip 1 and the inner lead portions 21b are electrically connected respectively to each other via the wiring layers 32 of the wiring member 30. More specifically, the sheet-form wiring member 30 is disposed on the semiconductor chip 1 such that the wiring layers 32 face the semiconductor chip 1. The wiring member 30 is then positioned such that the one end portions of the wiring layers 32 make contact with the metal stud bumps 4 of the inner lead portions 21b, and that the second ends of the layers 32 make contact with the metal stud bumps 5 of the electrode pads 2. And by using an apparatus such as a heat-press bonding apparatus, the one and the other end portions of the wiring layers 32 are bonded by heat-press bonding (gold-tin eutectic bonding) to the metal stud bumps 4 of the inner lead portions 21b and the metal stud bumps 5 of the electrode pads 2, respectively, so that the wiring layers 32 and the metal stud bumps 4 and 5 are fixed together.

Figure 10:
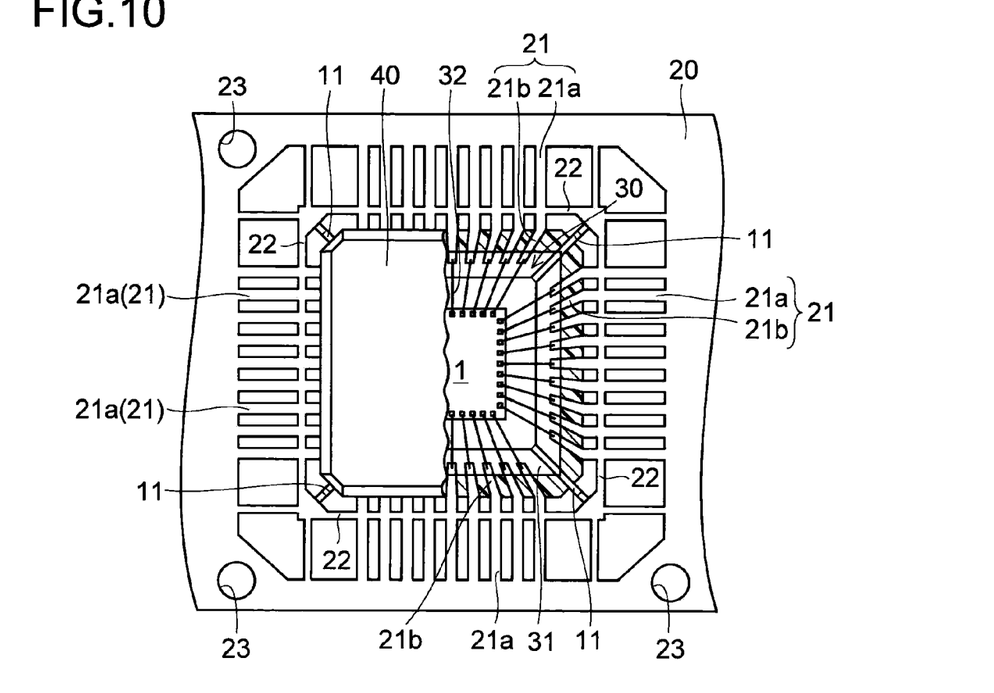
FIG. 10 is a plan view for explaining the method for manufacturing the semiconductor device in accordance with the one embodiment of the present invention.

Subsequently, by using an apparatus such as a transfer molding apparatus, the semiconductor chip 1, the die pad 10, the sheet-form wiring member 30 and the inner lead portions 21b of the lead terminals 21 are sealed in the sealing-resin layer 40 as shown in FIG. 10.

Thereafter, parts of the suspension leads 11 protruding from the sealing-resin layer 40, the lead terminals 21 (outer lead portions 21a) and the dam portions 22 are all cut off. Finally, the outer lead portions 21a are bent in a gull-wing like shape outside the resin layer 40. In this manner, the semiconductor device in accordance with this embodiment of the present invention shown in FIG. 1 is manufactured.

The embodiment disclosed herein is to be considered in all respects as illustrative and not restrictive. The scope of the present invention is set out in the appended claims and not in the description of the embodiment hereinabove, and includes any changes or modifications within the sense and scope equivalent to those of the claims.

For instance, although the above-described embodiment deals with an example in which the invention is applied to a QFP type semiconductor device, this is not intended to limit the application of the invention; the invention may be applied to BGA (Ball Grid Array) type semiconductor devices, QFN (Quad Flat Non-Leaded Package) type semiconductor devices and the like. Also, a semiconductor device of the present invention may be formed into any type of package other than those mentioned above.

Moreover, although the above-described embodiment deals with an example in which the wiring layers and the stud bumps are composed of gold (Au), this is not intended to limit the invention; the wiring layers and the stud bumps may also be composed of any conductive material other than gold (Au). For example, the wiring layers and the stud bumps may be composed of copper (Cu). Note that in this case it is possible to obtain the benefit of effectively reducing the manufacturing costs.

Furthermore, although the above-described embodiment deals with an example in which the metal stud bumps are formed on the upper surfaces of the inner lead portions and on the upper surfaces of the electrode pads, this is not intended to limit the invention; the invention may also be feasible without the metal stud bumps formed on the upper surfaces of the inner lead portions and on the upper surfaces of the electrode pads. Instead of the metal stud bumps, a plated layer with a larger thickness may be formed on predetermined portions on the upper surfaces of the inner lead portions.

Moreover, although the above-described embodiment deals with an example in which the wiring member is formed using a sheet-form polyimide member, this is not intended to limit the invention; the wiring member of the invention may be formed using any insulating member other than a polyimide member.

Moreover, although the above-described embodiment deals with an example in which the semiconductor device is structured such that the main surface of the semiconductor chip are at substantially the same height as the upper surfaces of the inner lead portions in the Z-axis direction (the thickness direction of the semiconductor chip), this is not intended to limit the invention; the semiconductor device of the invention may also be structured such that the upper surface of the semiconductor chip is at a different height from the upper surfaces of the inner lead portions.

Moreover, although the above-described embodiment deals with an example in which the die pad is formed of the same material as the lead frame, this is not intended to limit the invention; the die pad of the invention may also be formed of any material other than that of the lead frame. For example, it may be formed of 42 alloy or Kovar alloy.

What is claimed is:

1. A semiconductor device comprising:
   a semiconductor chip;
   a lead terminal having one end thereof disposed toward the semiconductor chip; and
   a wiring member including an insulating sheet having a wiring conductor formed thereon, wherein
   the wiring conductor is formed on a semiconductor chip-side surface of the insulating sheet and does not protrude beyond sides of the insulating sheet that are substantially perpendicular to said surface, and
   the semiconductor chip and the one end of the lead terminal are electrically connected together via the wiring conductor.

2. The semiconductor device of claim 1, wherein the sheet is formed of a flat insulating sheet.

3. The semiconductor device of claim 1, wherein the wiring conductor is formed of a metal layer.

4. The semiconductor device of claim 1, further comprising:
   a die pad on which the semiconductor chip is mounted, wherein the lead terminal has a surface at a height different from a height of the die pad as measured in a thickness direction.

5. The semiconductor device of claim 1, wherein the lead terminal comprises a plurality of lead terminals, and
   bumps are provided one for each of the semiconductor chip and the lead terminals.

6. The semiconductor device of claim 1, further comprising a sealing resin layer sealing the semiconductor chip, the one end of the lead terminal, and the wiring member.

7. The semiconductor device of claim 1, wherein the sheet is formed of polyimide.

8. The semiconductor device of claim 1, wherein the wiring member comprises, as the wiring conductor, a plurality of wiring conductors insulated from one another.

9. The semiconductor device of claim 1, wherein the wiring conductor is formed in a straight line.

10. The semiconductor device of claim 1, wherein the semiconductor chip is fixed on an upper surface of the die pad with an adhesive layer in between.

11. The semiconductor device of claim 4, wherein the die pad has four suspension leads.

* * * * *